(12) United States Patent
Kitamoto

(10) Patent No.: US 9,341,695 B2
(45) Date of Patent: May 17, 2016

(54) ABNORMALITY DETECTION SYSTEM FOR ROTATION ANGLE SENSOR

(71) Applicant: JTEKT CORPORATION, Osaka-shi, Osaka (JP)

(72) Inventor: Hiroshi Kitamoto, Toyota (JP)

(73) Assignee: JTEKT CORPORATION, Osaka-shi (JP)

( * ) Notice: Subject to any disclaimer, the term of this patent is extended or adjusted under 35 U.S.C. 154(b) by 252 days.

(21) Appl. No.: 14/133,220

(22) Filed: Dec. 18, 2013

(65) Prior Publication Data
US 2014/0191625 A1 Jul. 10, 2014

(30) Foreign Application Priority Data
Jan. 8, 2013 (JP) ................................. 2013-001077

(51) Int. Cl.
| | | |
|---|---|---|
| *G01B 7/14* | (2006.01) | |
| *G01R 35/00* | (2006.01) | |
| *G01D 5/12* | (2006.01) | |
| *G01D 3/08* | (2006.01) | |
| *H02K 11/00* | (2016.01) | |
| *G01R 33/02* | (2006.01) | |
| *G01R 33/07* | (2006.01) | |

(52) U.S. Cl.
CPC ........ *G01R 35/00* (2013.01); *G01D 3/08* (2013.01); *G01D 5/12* (2013.01); *H02K 11/0021* (2013.01); *H02K 11/0047* (2013.01); *G01R 33/02* (2013.01); *G01R 33/07* (2013.01)

(58) Field of Classification Search
CPC ........... G01D 5/145; G01D 5/12; G01D 5/14; G01R 33/02; G01R 33/07; G01R 33/09; G01R 33/075
USPC ................ 324/51, 55, 200, 207.11, 207.13, 324/207.14, 207.23, 207.25; 310/10, 40 R, 310/66, 68 R, 68 B
See application file for complete search history.

(56) References Cited

U.S. PATENT DOCUMENTS

| | | | |
|---|---|---|---|
| 6,552,666 B1* | 4/2003 | Goto | ................... G01B 7/02 318/652 |
| 2002/0180428 A1 | 12/2002 | Weser | |

(Continued)

FOREIGN PATENT DOCUMENTS

| | | |
|---|---|---|
| EP | 1241438 A2 | 9/2002 |
| JP | A-2011-95094 | 5/2011 |
| WO | 2011/036196 A1 | 3/2011 |

OTHER PUBLICATIONS

Mar. 3, 2016 Search Report issued in European Patent Application No. 14150027.2.

*Primary Examiner* — Jermele M Hollington
*Assistant Examiner* — Raul Rios Russo
(74) *Attorney, Agent, or Firm* — Oliff PLC

(57) ABSTRACT

In an abnormality detection system for a rotation angle sensor, a fact that an abnormality has occurred in one of sine signals (S1, S2) or in one of cosine signals (S3, S4) is detected based on a sum of the electrical signals (S1, S2), and a sum of the electrical signals (S3, S4) (first detection result). A fact that an abnormality has occurred in one of the positive sine and cosine signals (S1, S3) or in one of the negative sine and cosine signals (S2, S4) by comparing a first temperature computed using a correlation between an amplitude and a temperature and based on the electrical signals (S1, S3), a second temperature computed using a correlation between the amplitude and a temperature and based on the electrical signals (S2, S4), and a third temperature detected by a temperature sensor with each other (second detection result). A microcomputer identifies which of the electrical signals is abnormal by comparing the first and second detection results with each other.

4 Claims, 4 Drawing Sheets

(56) References Cited

U.S. PATENT DOCUMENTS

| | | | |
|---|---|---|---|
| 2011/0087456 A1* | 4/2011 | Satou | B62D 5/049 702/151 |
| 2011/0187351 A1 | 8/2011 | Hunger | |
| 2012/0176070 A1 | 7/2012 | Wallrafen | |
| 2014/0375241 A1* | 12/2014 | Yamamoto | G01D 5/2046 318/490 |

* cited by examiner

ABNORMALITY DETECTION SYSTEM FOR ROTATION ANGLE SENSOR

INCORPORATION BY REFERENCE

The disclosure of Japanese Patent Application No. 2013-001077 filed on Jan. 8, 2013 including the specification, drawings and abstract, is incorporated herein by reference in its entirety.

BACKGROUND OF THE INVENTION

1. Field of the Invention

The invention relates to an abnormality detection system for a rotation angle sensor.

2. Description of the Related Art

As described in, for example, Japanese Patent Application Publication No. 2011-95094 (JP 2011-95094 A) (FIG. 14), using a magnetic sensor as a rotation angle sensor that detects a rotation angle of a rotary shaft of a motor or the like has been conventionally known. The magnetic sensor has two bridge circuits each including four magnetoresistive elements. The two bridge circuits generate electrical signals based on the direction of a magnetic field generated by a magnet disposed on the rotary shaft. The first bridge circuit generates two electrical signals corresponding to a cosine component of the rotation angle of the rotary shaft, and the second bridge circuit generates two electrical signals corresponding to a sine component of the rotation angle of the rotary shaft. A microcomputer obtains the cosine component of the rotation angle on the basis of the difference between the two electrical signals corresponding to the cosine component, and obtains the sine component of the rotation angle on the basis of the difference between the two electrical signals corresponding to the sine component. The microcomputer obtains the rotation angle of the rotary shaft by computing an arc tangent on the basis of the cosine component and the sine component.

The microcomputer detects the presence or absence of an abnormality of the magnetic sensor in order to ensure the reliability of detection of the rotation angle. The microcomputer detects the presence or absence of an abnormality of the magnetic sensor using the fact that the value of the sum of squares of the cosine component and the sine component ($=\sin^2 \theta + \cos^2 \theta$) is kept at a constant value when the magnetic sensor is normally operating. The microcomputer determines that an abnormality has occurred in the magnetic sensor when the value of the sum of squares falls outside an allowable range.

As illustrated in FIG. 6, when the cosine component and the sine component acquired by the microcomputer with a prescribed sampling period are plotted on an orthogonal coordinate system of $\cos \theta$ and $\sin \theta$, the locus of the plotted components forms a circle with a radius R0 if the cosine component and the sine component are normal. The allowable range of the values of the sum of squares is set by providing a range having a constant width on each of the inside and outside of the normal circle with the radius R0. An upper limit circle with a radius R1, which is the upper limit of the allowable range, is set outside the normal circle with the radius R0, and a lower limit circle with a radius R2, which is the lower limit of the allowable range, is set inside the normal circle with the radius R0. When the cosine component and the sine component are plotted outside the upper limit circle or inside the lower limit circle on the orthogonal coordinate system of $\cos \theta$ and $\sin \theta$, the microcomputer determines that an abnormality has occurred in the magnetic sensor.

However, when the presence or absence of an abnormality of the magnetic sensor is detected on the basis of the value of the sum of squares of the cosine component and the sine component, there is the following problem. The electrical signals generated by the magnetic sensor are influenced by the temperature. The amplitudes of a total of four electrical signals generated by the two bridge circuits vary depending on the ambient temperature of the moment. Therefore, the allowable range, that is, the range of values of the sum of squares, which should be recognized as being normal, needs to be set to a range that is larger than an original allowable range by an amount corresponding to the amplitude variations due to the temperature characteristics of the magnetic sensor. As a result, a value of the sum of squares that should be recognized as being abnormal may fall inside the allowable range.

SUMMARY OF THE INVENTION

One object of the invention is to provide an abnormality detection system for a rotation angle sensor, having an improved capability of detecting an abnormality of a magnetic sensor.

An abnormality detection system for a rotation angle sensor according to an aspect of the invention includes: a magnetic sensor that generates four electrical signals having different phases in accordance with rotation of a rotary shaft that is a sensing target; and a control circuit that computes a rotation angle of the rotary shaft based on the tour electrical signals generated by the magnetic sensor. The four electrical signals include positive and negative two sine signals having a phase difference of 180° and positive and negative two cosine signals having a phase difference of 180°.

The abnormality detection system for a rotation angle sensor configured as described above further includes a temperature sensor that detects an ambient temperature of the magnetic sensor. The control circuit has a first detection function and a second detection function.

The first detection function is a function of detecting a fact that an abnormality has occurred in any one of the positive and negative two sine signals or in any one of the positive and negative two cosine signals based on a value of a sum of the positive and negative two sine signals and a value of a sum of the positive and negative two cosine signals The second detection function is a function of detecting a fact that an abnormality has occurred in any one of the positive sine signal and the positive cosine signal or in any one of the negative sine signal and the negative cosine signal by comparing first to third temperatures with each other. The first temperature is computed based on a correlation between a temperature and an amplitude acquired from a value of a sum of squares of the positive sine signal and the positive cosine signal. The second temperature is computed based on a correlation between a temperature and an amplitude acquired from a value of a sum of squares of the negative sine signal and the negative cosine signal. The third temperature is detected by the temperature sensor.

The control circuit identifies which of the four electrical signals is abnormal by comparing results of detection obtained by the first detection function and the second detection function with each other. With this configuration, it is possible to identify which of the four electrical signals generated by the magnetic sensor is abnormal. In a case where an abnormality has occurred in the positive sine signal, the value of the sum of the positive sine signal and the negative sine signal does not coincide with the theoretical value (=0), it is determined by the first detection function that an abnormality has occurred in any one of the positive sine signal and the negative singe signal. Because the first temperature computed based on the value of the sum of squares of the positive sine signal and the positive cosine signal differs from the second and third temperatures, it is determined by the second detection function that an abnormality has occurred in any one of the positive sine signal and the positive cosine signal. Therefore, by comparing the first detection result and the second detection result with each other, it is determined that an abnormality has occurred in the positive sine signal.

In addition, the following advantageous effect is obtained. An abnormality of the rotation angle sensor is detected based on the comparison among the temperatures correlated with the amplitude instead of the comparison based on the amplitude that is easily influenced by the temperature (comparison among the values of the sums of squares). Therefore, the result of detection of presence or absence of the abnormality is less likely to be influenced by the temperature. Because the result of detection of the presence or absence of an abnormality is less likely to be influenced by the temperature, the capability of detecting an abnormality in the rotation angle sensor is improved.

With the abnormality detection system for a rotation angle sensor according to the above-described aspect, it is possible to identify which of the four electrical signals generated by the magnetic sensor is abnormal. Therefore, the control circuit is able to execute so-called backup control. In the backup control, when the fact that an abnormality has occurred in any one of the four control signals is detected, the rotation angle is computed based on the remaining normal positive sine and cosine signals, or the remaining normal negative sine signal and cosine signals.

The control circuit may detect a fact that an abnormality has occurred in any one of the remaining normal positive sine and cosine signals or the remaining normal negative sine and cosine signals, by comparing a temperature computed based on a correlation between a temperature and an amplitude acquired from a value of a sum of squares of the remaining normal positive sine and cosine signals or the remaining normal negative sine and cosine signals with the third temperature detected by the temperature sensor during execution of the backup control.

With this configuration, it is possible to appropriately execute detection of an abnormality during the backup control without the influence of the temperature. In the abnormality detection system for a rotation angle sensor, the rotary shaft may be a rotary shaft of a motor. In this case, the temperature sensor may be provided to protect a drive circuit of the motor from overheating.

With this configuration, a dedicated temperature sensor for detecting an abnormality of the magnetic sensor need not be provided.

With the configuration described above, it is possible to improve the capability of detecting an abnormality of the magnetic sensor.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Figure 1:
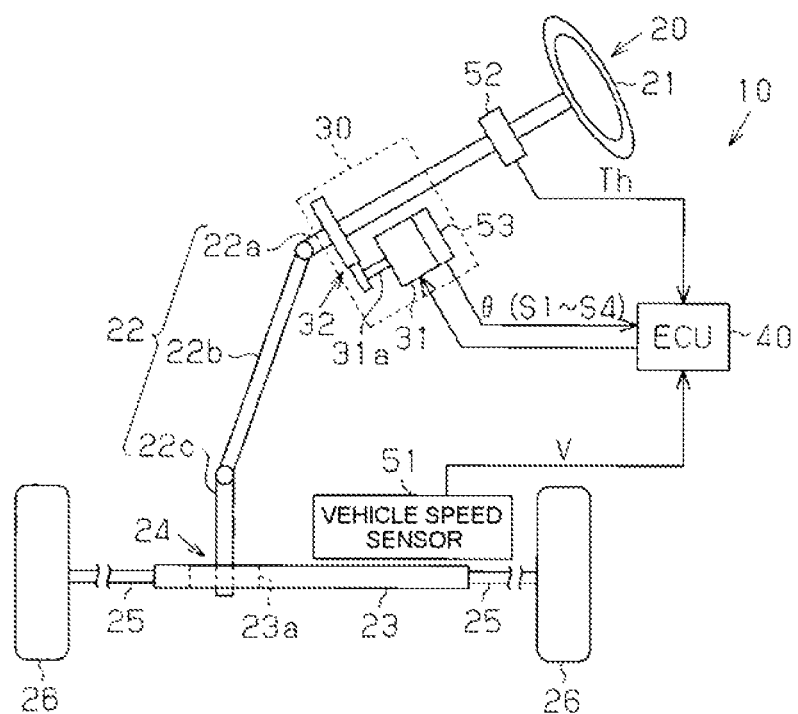
FIG. 1 is a block diagram illustrating the configuration of an electric power steering system.

Hereinafter, description will be provided on an embodiment in which an abnormality detection system for a rotation angle sensor according to the invention is applied to an electric power steering system. As illustrated in FIG. 1, an electric power steering system (EPS) 10 includes a steering mechanism 20 that steers steered wheels on the basis of a driver's steering operation, a steering assist mechanism 30 that assists the driver's steering operation, and an electronic control unit (ECU) 40 that controls the operation of the steering assist mechanism 30.

The steering mechanism 20 includes a steering wheel 21 that is operated by the driver, and a steering shaft 22 that rotates together with the steering wheel 21. The steering shaft 22 includes a column shaft 22a connected to the center of the steering wheel 21, an intermediate shaft 22b connected to the lower end of the column shaft 22a, and a pinion shaft 22c connected to the lower end of the intermediate shaft 22b. The lower end of the pinion shaft 22c engages with a portion 23a of a rack shaft 23 extending in a direction that intersects with the pinion shaft 22c. Rack teeth are formed in the portion 23a of the rack shaft 23. Therefore, the rotational motion of the steering shaft 22 is converted into a reciprocating linear motion of the rack shaft 23 by a rack and pinion mechanism 24 including the pinion shaft 22c and the rack shaft 23. The reciprocating linear motion is transmitted to right and left steered wheels 26 via tie rods 25 connected to respective ends of the rack shaft 23, whereby the steered angle of the steered wheels 26 is changed. As the steered angle of the steered wheels 26 is changed, the traveling direction of a vehicle is changed.

The steering assist mechanism 30 includes a motor 31 that is a generation source of a steering assist force. A three-phase alternating-current (AC) motor such as a brushless motor is employed as the motor 31. A rotary shaft 31a of the motor 31 is connected to the column shaft 22a via a speed reduction mechanism 32. The speed reduction mechanism 32 reduces the speed of rotation output from the motor 31 and transmits the rotation with a reduced speed to the column shaft 22a. As the torque output from the motor is applied to the steering shaft 22 as a steering assist force, the driver's steering operation is assisted.

The ECU 40 acquires results of detection executed by various sensors disposed in the vehicle as information indicating the driver's request or the traveling state, and controls the motor 31 on the basis of the acquired various information. Examples of the various sensors include a vehicle speed sensor 51, a torque sensor 52, and a rotation angle sensor 53. The vehicle speed sensor 51 is disposed in the vehicle, and detects a vehicle speed V. The torque sensor 52 is disposed on the column shaft 22a. The torque sensor 52 detects a steering torque Th that is applied to the steering shaft 22 in response to the driver's steering operation. The rotation angle sensor 53 is disposed at an end of the motor 31, the end being on the opposite side of the motor 31 from the speed reduction mechanism 32, and generates electrical signals S1 to S4 corresponding to a rotation angle θ of the rotary shaft 31*a*. The ECU 40 detects the rotation angle θ on the basis of the electrical signals S1 to S4 generated by the rotation angle sensor 53. The ECU 40 computes a target assist torque on the basis of the vehicle speed V, the steering torque Th, and the rotation angle θ. The ECU 40 executes feedback control on the current to be supplied to the motor 31 such that the assist torque applied from the motor 31 to the column shaft 22*a* coincides with the target assist torque.

Figure 2:
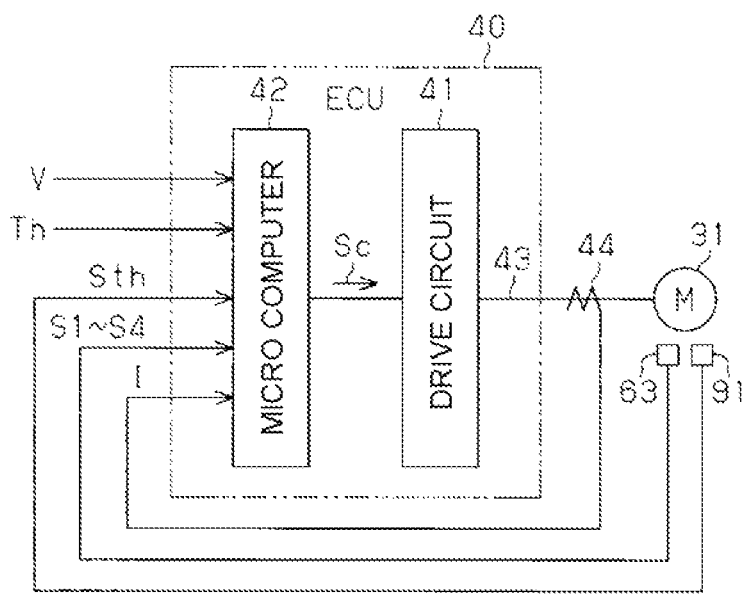
FIG. 2 is a block diagram illustrating the configuration of an electronic control unit (ECU)

The configuration of the ECU 40 will be described below. As illustrated in FIG. 2, the ECU 40 includes a drive circuit (inverter circuit) 41 and a microcomputer 42.

The drive circuit 41 is a known PWM inverter in which three arms corresponding to three phases (U, V, W) are connected in parallel. In such a PWM inverter, two switching elements, such as field effect transistors (FETs), connected in series are used as a basic unit (arm). The drive circuit 41 converts direct current supplied from a DC power source such as a battery into three-phase alternating currents by making switchover among the switching elements on the basis of a motor control signal Sc generated by the microcomputer 42. The three-phase alternating currents are supplied to the motor 31 via power supply paths 43 for respective phases. Current sensors 44 are disposed on the power supply paths 43 for the respective phases. The current sensors 44 detect actual current values I, which are values of currents that flow through the power supply paths 43 for the respective phases. In FIG. 2, for convenience of explanation, the power supply paths 43 for the respective phases are collectively illustrated as a single path and the current sensors 44 for the respective phases are collectively illustrated as a single sensor.

The microcomputer 42 computes a current command value corresponding to a target assist torque that should be generated by the steering assist mechanism 30, on the basis of the vehicle speed V and the steering torque Th. The microcomputer 42 executes current feedback control such that the actual current value I follows the current command value, on the basis of the current command value, the actual current value I and the rotation angle θ of the motor 31. The microcomputer 42 computes a deviation between the current command value and the actual current value I, and generates a motor control signal Sc (PWM drive signal) for eliminating the deviation. The motor control signal Sc defines an on-duty ratio of each switching element of the drive circuit 41. As the currents based on the motor control signal Sc are supplied to the motor 31 via the drive circuit 41, the motor 31 generates torque corresponding to the target assist torque.

Figure 3:
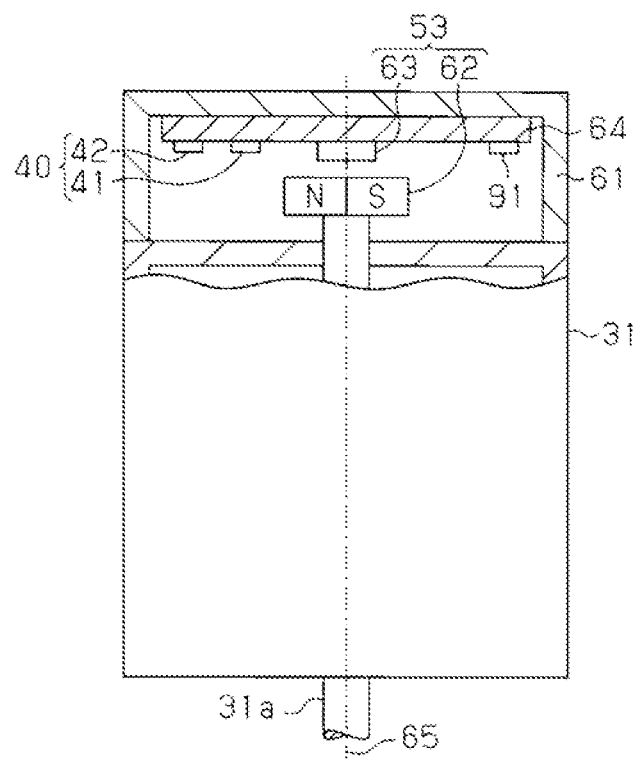
FIG. 3 is a sectional view illustrating main portions of a motor provided with a rotation angle sensor.

The mechanical configuration of the rotation angle sensor 53 will be described below. As illustrated in FIG. 3, the rotation angle sensor 53 is disposed in a housing 61 attached to the end (the upper portion in FIG. 3) of the motor 31, the end being on the opposite side of the motor 31 from the speed reduction mechanism 32. The rotation angle sensor 53 includes a bias magnet 62 and a magnetoresistive sensor (MR sensor) 63 that is a magnetic sensor. The bias magnet 62 is fixed to an end of the rotary shaft 31*a*. The MR sensor 63 is disposed on a substrate 64 fixed to the inner bottom face of the housing 61. The MR sensor 63 faces the bias magnet 62 in a direction along the axis 65 of the rotary shaft 31*a*. The ECU 40 and a temperature sensor 91 are also disposed on the substrate 64.

Figure 4:
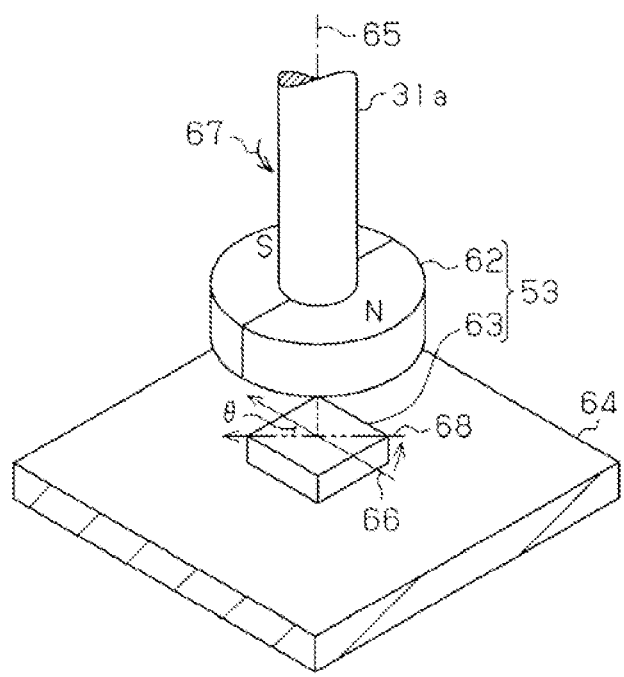
FIG. 4 is a perspective view of the rotation angle sensor.

As illustrated in FIG. 4, the bias magnet 62 is a columnar bipolar magnet in which a north pole and a south pole are formed so as to be adjacent to each other in the circumferential direction. A bias magnetic field in the direction from the north pole toward the south pole as indicated by a solid arrow 66 is applied to the MR sensor 63 by the bias magnet 62. For example, when the rotary shaft 31*a* is rotated by an angle θ in the direction indicated by an arrow 67 from the position illustrated in FIG. 4, the bias magnet 62 is also rotated by the angle θ in the direction indicated by the arrow 67. Thus, the direction of the bias magnetic field applied to the MR sensor 63 changes from the direction indicated by the solid arrow 66 to the direction indicated by a two-dot chain arrow 68, which is achieved by rotating the direction of the bias magnetic field by the angle θ about the axis 65. In this way, the direction of the magnetic field applied to the MR sensor 63 varies depending on the rotation angle θ of the rotary shaft 31*a*.

The MR sensor 63 will be described in detail below. The MR sensor 63 detects the direction of the bias magnetic field applied by the bias magnet 62, and generates electrical signals S1 to S4 based on the detected direction.

Figure 5:
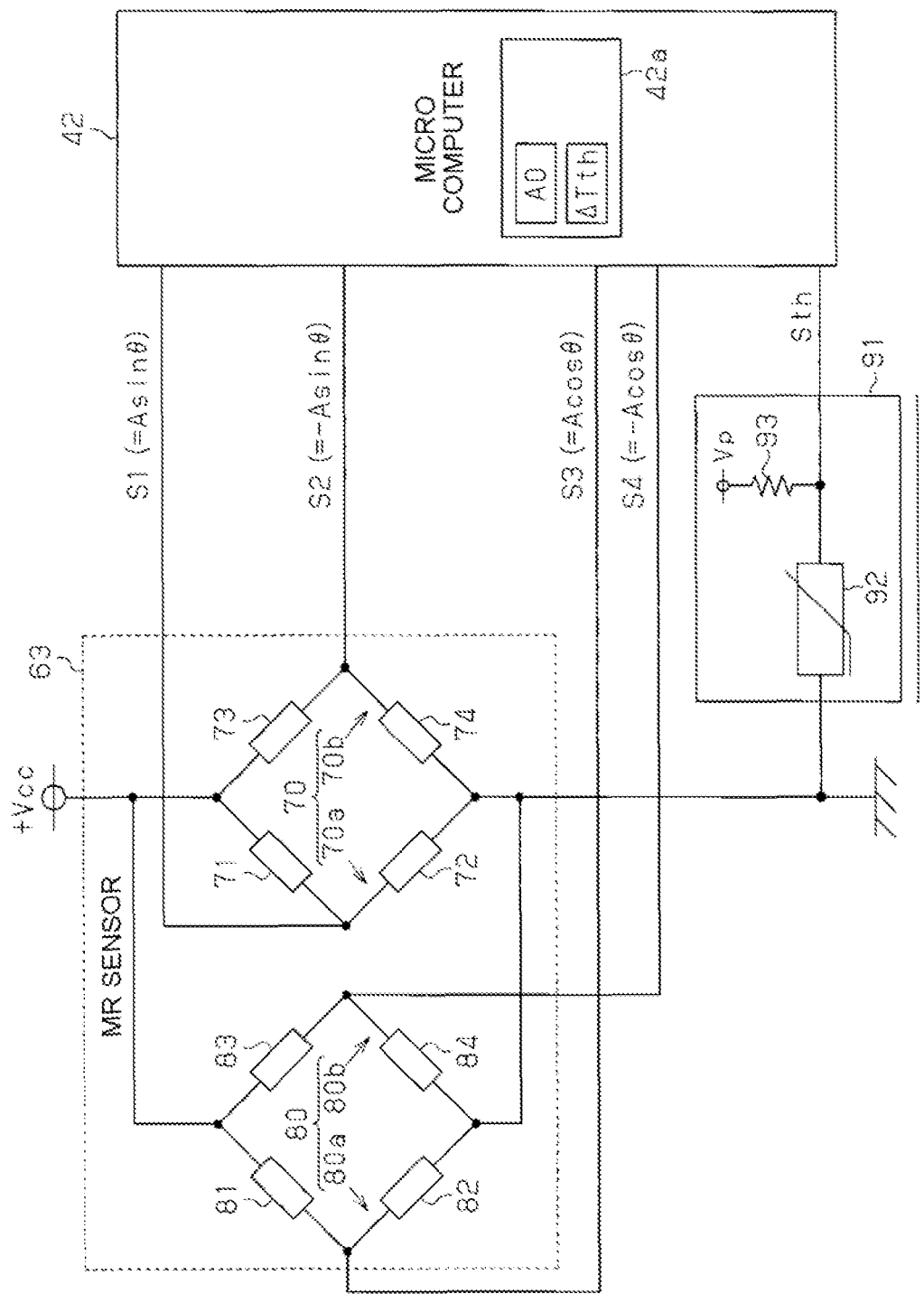
FIG. 5 is a circuit diagram illustrating an equivalent circuit of a magnetic sensor.

As illustrated in FIG. 5, the MR sensor 63 includes a first bridge circuit 70 and a second bridge circuit 80. The first bridge circuit 70 has a configuration in which four magnetoresistive elements 71 to 74 are arranged in a bridge form. The second bridge circuit 80 has a configuration in which four magnetoresistive elements 81 to 84 are arranged in a bridge form.

The first bridge circuit 70 is formed of a half bridge circuit 70*a* in which two magnetoresistive elements 71, 72 out of the four magnetoresistive elements are connected in series, and a half bridge circuit 70*b* in which the other two magnetoresistive elements 73, 74 are connected in series. First ends of the two half bridge circuits 70*a*, 70*b* are connected to a power source (source voltage+Vcc). Second ends of the two half bridge circuits 70*a*, 70*b* are grounded. The first bridge circuit 70 outputs a potential at the middle point between the two magnetoresistive elements 71, 72 as a first electrical signal S1, and outputs a potential at the middle point between the two magnetoresistive elements 73, 74 as a second electrical signal S2.

When the bias magnet 62 rotates together with the rotary shaft 31*a* and the direction of the bias magnetic field applied to the magnetoresistive elements 71 to 74 varies, the resistance values of the magnetoresistive elements 71 to 74 vary depending on the variation of the direction of the bias magnetic field. As the resistance values of the magnetoresistive elements 71 to 74 vary, the first and second electrical signals S1, S2 vary. That is, the first and second electrical signals S1, S2 vary depending on the rotation angle θ of the rotary shaft 31*a*.

In the present embodiment, as the arrangements (reference directions) of the magnetoresistive elements 71 to 74 are adjusted as needed, the first and second electrical signals S1, S2 vary as follows. The first electrical signal S1 is a sine signal with an amplitude A, which varies sinusoidally with respect to the rotation angle θ of the rotary shaft 31*a*. The second electrical signal is a −sine signal with an amplitude A, of which the phase is different by 180° from that of the first electrical signal S1. The first and second electrical signals S1, S2 can be expressed by Expressions (1), (2) respectively.

$$S1 = A \sin \theta \quad (1)$$

$$S2 = -A \sin \theta \quad (2)$$

The second bridge circuit 80 has the same circuit configuration as that of the first bridge circuit 70. The second bridge circuit 80 is formed of a half bridge circuit 80*a* in which two magnetoresistive elements 81, 82 are connected in series, and a half bridge circuit 80*b* in which two magnetoresistive elements 83, 84 are connected in series. First ends of the two half bridge circuits 80*a*, 80*b* are connected to the power source. Second ends of the two half bridge circuits 80*a*, 80*b* are grounded. The second bridge circuit 80 outputs a potential at the middle point between the two magnetoresistive elements 81, 82 as a third electrical signal S3, and outputs a potential at the middle point between the two magnetoresistive elements 83, 84 as a fourth electrical signal S4.

Although not illustrated in the drawings, the first and second bridge circuits 70, 80 are arranged in a concentric manner on the same sensor substrate. The second bridge circuit 80 is disposed so as to be offset from the first bridge circuit 70 by a prescribed angle (45°) in the rotation direction of the rotary shaft 31*a*. Thus, the third electrical signal S3 is a cosine signal with an amplitude A, of which the phase is retarded by 90° with respect to that of the first electrical signal S1. The fourth electrical signal S4 is a –cosine signal with an amplitude A, of which the phase is different by 180° from that of the third electrical signal S3. That is, the third and fourth electrical signals S3, S4 can be expressed by Expressions (3), (4), respectively.

$$S3 = A \cos \theta \quad (3)$$

$$S4 = -A \cos \theta \quad (4)$$

The rotation angle detecting process will be described below. The microcomputer 42 acquires the first and second electrical signals S1, S2 output from the first bridge circuit 70 and the third and fourth electrical signals S3, S4 output from the second bridge circuit 80 with a prescribed sampling period. The microcomputer 42 computes a difference between the first electrical signal S1 and the second electrical signal S2 and a difference between the third electrical signal S3 and the fourth electrical signal S4 as expressed by Expressions (5), (6), respectively. Thus, signals with an amplitude 2A, which is twice as large as that of the first to fourth electrical signals S1 to S4, are obtained. Then, the microcomputer 42 detects the rotation angle θ of the rotary shaft 31*a* by computing an arc tangent value on the basis of the two difference values as expressed by Expression (7).

$$\text{First difference value (sine component)} = S1 - S2 = 2A \sin \theta \quad (5)$$

$$\text{Second difference value (cosine component)} = S3 - 4 = 2A \cos \theta \quad (6)$$

$$\theta = (2A \sin \theta / 2A \cos \theta) \quad (7)$$

Note that, the microcomputer 42 may detect the rotation angle θ of the rotary shaft 31*a* by computing an arc tangent value based on the first electrical signal S1 and the third electrical signal 83 as expressed by Expression (8), or by computing an arc tangent value based on the second electrical signal S2 and the fourth electrical signal S4 as expressed by Expression (9).

$$\theta = \text{Arctan}(S1/S3) \quad (8)$$

$$\theta = \text{Arctan}(S2/S4) \quad (9)$$

The microcomputer 42 has various abnormality detection functions. Examples of the abnormality detection functions include a function of protecting the drive circuit 41 from overheating and a function of detecting an abnormality of the MR sensor 63.

The function of protecting the drive circuit 41 from overheating will be described below. The switching elements of the drive circuit 41 are heated when being energized based on the motor control signal Sc. As a result, the temperatures of the switching elements rise and the switching elements may be overheated. The electric power steering system 10 according to the present embodiment has the following configuration for preventing burnout of the switching elements due to overheating.

As illustrated in FIG. 3, the temperature sensor 91 is disposed on the substrate 64 on which the drive circuit 41 is disposed. As illustrated in the lower part of FIG. 5, the temperature sensor 91 is configured as a voltage-dividing circuit formed of a thermistor 92 and a pull-up resistor 93. The pull-up resistor 93 and the thermistor 92 are connected in series in this order between a constant voltage source (voltage Vp, for example, 5V) and the ground. The thermistor 92 is a resistive element of which the resistance value varies with a temperature change. When the resistance value of the thermistor 92 varies with the temperature change, the currents flowing through the thermistor 92 and the pull-up resistor 93 vary and voltages based on the current variations are generated in the thermistor 92 and the pull-up resistor 93. The microcomputer 42 acquires the voltage generated in the thermistor 92 with the temperature change as an electrical signal Sth, and detects the temperature inside the housing 61 on the basis of the acquired electrical signal Sth. Note that, because there is a correlation between the voltage of the thermistor 92 and the temperature, the temperature can be obtained by obtaining the voltage of the thermistor 92.

The microcomputer 42 indirectly detects the presence or absence of an abnormality of the temperature of the drive circuit 41 on the basis of the temperature inside the housing 61. The microcomputer 42 generates the motor control signal Sc, for example, so as to limit the current to be supplied to the motor 31, when the detected temperature exceeds a threshold temperature. By reducing the current supplied to the motor 31, the temperature of the drive circuit 41 is decreased and thus overheating of the switching elements is suppressed.

The microcomputer 42 also monitors the presence or absence of an abnormality of the temperature sensor 91. The microcomputer 42 acquires the electrical signal Sth with a prescribed sampling period, and detects the fact that the temperature sensor 91 is in a so-called open state due to disconnection or the like when the value (voltage value) of the acquired electrical signal Sth approximates the voltage Vp of the constant voltage source. The microcomputer 42 detects the fact that the temperature sensor 91 is in a short-circuit state when the value of the acquired electrical signal Sth approximates the ground potential (0V).

The function of detecting an abnormality of the MR sensor 63 will be described below. In normal times, the microcomputer 42 monitors whether the first to fourth electrical signals S1 to S4 are abnormal (first failure monitoring).

The first and second electrical signals S1, S2 are different by 1800 in phase from each other. Accordingly, Expression (10) is theoretically satisfied. The third and fourth electrical signals S3, S4 are different by 180° in phase from each other. Accordingly, Expression (11) is theoretically satisfied.

$$S1 + S2 = 0 \quad (10)$$

$$S3 + S4 = 0 \quad (11)$$

When Expression (10) is not satisfied, it is determined that the first electrical signal S1 or the second electrical signal S2 is abnormal. When Expression (11) is not satisfied, it is determined that the third electrical signal S3 or the fourth electrical signal S4 is abnormal. Note that, actually, an allowable range with respect to zero is set by taking into account an error, and the microcomputer 42 determines that an abnormality has occurred when the sum of the first and second electrical signals S1, S2 or the sum of the third and fourth electrical signals S3, S4 falls outside the allowable range (range between the upper limit and the lower limit, inclusive).

When it is determined that the first electrical signal S1 or the second electrical signal 2 is abnormal, or the third electrical signal S3 or the fourth electrical signal S4 is abnormal, the control of the motor 31 by the microcomputer 42 may be stopped. However, in the electric power steering system 10, it is preferable that application of a steering assist force should be continued, from the viewpoint of avoiding an abrupt change of a steering feeling and maintaining a natural steering feeling without causing an uncomfortable feeling.

When an abnormality has occurred in any one of the first to fourth electrical signals S1 to S4, it is possible to obtain the rotation angle θ using the normal sine and cosine two signals of which the sign is opposite to the sign of the abnormal signal. By executing backup control on the motor 31 on the basis of the rotation angle θ, it is possible to continue application of the steering assist force.

In order to execute the backup control on the motor 31 based on the sine and cosine two signals, it is necessary to identify the signal in which an abnormality has occurred. In this regard, the microcomputer 42 is able to detect the fact that the first electrical signal S1 or the second electrical signal S2 is abnormal or the fact that the third electrical signal S3 or the fourth electrical signal S4 is abnormal through the monitoring based on Expressions (10) and (11). For example, when an abnormality has occurred in the first electrical signal S1, the microcomputer 42 detects the fact that the first electrical signal S1 or the second electrical signal S2 is abnormal on the basis of the fact that Expression (10) is not satisfied. However, at this time, it is not possible to identify which of the first and second electrical signals S1, S2 is abnormal.

In the present embodiment, which of the first to fourth electrical signals S1 to S4 is abnormal is identified as follows. In the present embodiment, on the basis of the fact that there is a correlation between the ambient temperature of the MR sensor 63 and the amplitude of the first to fourth electrical signals S1 to S4, a signal in which an abnormality has occurred is identified as follows.

With the use of the amplitude-temperature characteristics of the MR sensor 63, the microcomputer 42 computes a first temperature T1 on the basis of the first and third electrical signals S1, S3 having the positive (+) sign, and computes a second temperature 2 on the basis of the second and fourth electrical signals S2, S4 having the negative (−) sign. Although not described herein for the convenience of explanation, the first and second temperatures T1, T2 are computed according to Expression (18) (described later). A temperature Ta obtained when the amplitude A computed on the basis of the value of the sum of squares of the first and third electrical signals S1, S3 is applied to Expression (18) is the first temperature T1. A temperature Ta obtained when the amplitude A computed on the basis of the value of the sum of squares of the second and fourth electrical signals S2, S4 is applied to Expression (18) is the second temperature T2.

By comparing the first and second temperatures T1, T2 and a third temperature T3 obtained with the use of the temperature sensor 91 with each other, it is possible to detect an abnormality of the MR sensor 63 and an abnormality of the temperature sensor 91 independently of each other. Note that, it is preferable to satisfy the precondition that the temperature sensor 91 is disposed in the atmosphere with substantially the same temperature as that of the atmosphere in which the MR sensor 63 is disposed. In the present embodiment, the temperature sensor 91 and the MR sensor 63 are disposed in the single housing 61, as described above. Therefore, when both the MR sensor 63 and the temperature sensor 91 are normally operating, the first to third temperatures T1 to T3 exhibit values that approximate each other.

The microcomputer 42 identifies the abnormal electrical signal using the computed first to third temperatures T1 to T3. For example, when an abnormality has occurred in the first electrical signal S1, the value of the first temperature T1, which is acquired on the basis of the first and third electrical signals S1, S3, is also abnormal. The microcomputer 42 detects the abnormality of the first temperature T1 by comparing the first to third temperatures T1 to T3 with each other. When the second temperature T2 and the third temperature T3 exhibit values that approximate each other and only the first temperature T1 is greatly different from the second and third temperatures T2, T3, it is determined that the first temperature T1 is abnormal. When the first temperature T1 is abnormal, one of the first electrical signal S1 and the third electrical signal S3 that are used to compute the first temperature T1 is suspected to be abnormal.

The microcomputer 42 identifies, as the abnormal electrical signal, the electrical signal that satisfies both two conditions for identifying the electrical signals that are suspected to be abnormal as described above, that is. Condition A and Condition B.

Condition A is a condition that the electrical signal suspected to be abnormal is a sine electrical signal. In this specification, the sine electrical signals are the first electrical signal S1 and the second electrical signal S2. Condition B is a condition that the electrical signal suspected to be abnormal is an electrical signal having the positive (+) sign. In this specification, the electrical signals having the positive (+) sign are the first electrical signal S1 and the third electrical signal S3.

As shown in Table 1, the electrical signal that satisfies both Condition A and Condition B is only the first electrical signal S1 out of the first to fourth electrical signals S1 to S4. Therefore, the microcomputer 42 is able to identify the first electrical signal S1 as an abnormal electrical signal.

TABLE 1

| Abnormality detecting method | Signal suspected to be abnormal | Signal suspected to be abnormal |
| --- | --- | --- |
| Expressions (10), (11) | First electrical signal S1 | Second electrical signal S2 |
| Comparison among first to third temperatures T1 to T3 | First electrical signal S1 | Third electrical signal S3 |
| Abnormality determination result | Abnormal | Normal |

The case where an abnormality has occurred in the first electrical signal S1 is described above as an example. However, even when an abnormality has occurred in any one of the second to fourth electrical signals S2 to S4, the abnormal electrical signal can be identified in the same way as described above. Because the abnormal electrical signal is identified, the microcomputer 42 recognizes that it is possible to switch the control of the motor 31 from the normal control to the backup control.

The backup control that is executed in "one kind electrical signal abnormality state" will be described below. In the present embodiment, there are two kinds of electrical signals, that is, the electrical signals having the positive (+) sign and the electrical signals having the negative (−) sign. The state where an abnormality has occurred in an electrical signal of one kind out of the two kinds is referred to as "one kind electrical signal abnormality state".

When it is determined that an abnormality has occurred in any one of the first to fourth electrical signals S1 to S4, the microcomputer 42 computes the rotation angle θ of the rotary shaft 31a using the electrical signals having the same sign among the remaining normal electrical signals (backup control).

For example, when an abnormality is detected in the first electrical signal S1 or the third electrical signal S3, the microcomputer 42 computes the rotation angle θ of the rotary shaft 31a by applying the second and fourth electrical signals S2, S4 having the negative (−) sign, which are normal, to Expression (9). Similarly, when an abnormality is detected in the second electrical signal S2 or the fourth electrical signal S4, the microcomputer 42 computes the rotation angle θ of the rotary shaft 31a by applying the first and third electrical signals S1, S3 having the positive (+) sign, which are normal, to Expression (8).

As described above, because the first electrical signal S1 is identified as an abnormal electrical signal, the microcomputer 42 switches the control of the motor 31 from the normal control to the backup control. In this case, because the first electrical signal S1 is abnormal, the microcomputer 42 computes the rotation angle θ by applying the second electrical signal S2 and the fourth electrical signal S4 having the negative (−) sign out of the second to fourth electrical signals S2 to S4, which are normal, to Expression (9).

Note that, the normal control means the control in which the rotation angle θ of the rotary shaft 31a is computed according to Expressions (5), (6), (7) using all the first to fourth electrical signals S1 to S4 as described above.

During execution of the backup control, the microcomputer 42 monitors whether an abnormality has occurred in the two normal electrical signals used in the backup control. In this case, because the first electrical signal S1 is abnormal, the second and fourth electrical signals S2, S4 are used in the backup control as described above.

The microcomputer 42 monitors whether an abnormality has occurred using characteristic C and characteristic D described below. Characteristic C is a characteristic that the value the sum of the square of the sine electrical signals and the square of the cosine electrical signals (hereinafter, referred to as "sum of squares"), is a constant value.

Characteristic D is a characteristic that there is a correlation between the amplitude A of the first to fourth electrical signals S1 to S4 and the temperature. The microcomputer 42 first computes the value of the sum of squares of the second and fourth electrical signals S2, S4, which are normal, presently used in the backup control according to Expression (12).

$$S2^2 + S4^2 = A^2 \sin^2 \theta + A^2 \cos^2 \theta = A^2(\sin^2 \theta + \cos^2 \theta) \quad (12)$$

Then, the microcomputer 42 computes the amplitude A from the result of computation of the sum of squares of the second and fourth electrical signals S2, S4 which are normal.

When the second and fourth electrical signals S2, S4 are normal, Expression (13) is satisfied.

$$\sin^2 \theta + \cos^2 \theta = 1 \quad (13)$$

Therefore, Expression (12) can be expressed as follows.

$$S2^2 + S4^2 = A^2(\sin^2 \theta + \cos^2 \theta) = A^2$$

As expressed by Expression (14), the microcomputer 42 acquires the amplitude A of the second and fourth electrical signals S2, S4 by computing the square root of $A_2$ which is the result of computation of the sum of squares.

$$2\sqrt{A^2} = A \quad (14)$$

Then, the microcomputer 42 doubles the amplitude A to compute a peak-to-peak value App of the second and fourth electrical signals S2, S4 as expressed by Expression (15).

$$App = 2A \quad (15)$$

The amplitude A can be expressed by Expression (16).

$$A = A0 \pm \alpha \times Ta \quad (16)$$

Note that, A0 represents the amplitude of the first to fourth electrical signals S1 to S4 generated by the MR sensor 63 when the ambient temperature is a normal temperature (25° C.). The value of the amplitude A0 at the normal temperature is stored in advance in a storage device 42a of the microcomputer 42. In addition, α represents a coefficient (amplitude/temperature coefficient) that reflects a rate of change in the amplitude due to the temperature. The coefficient is a value defined on the basis of the design specifications of the MR sensor 63 and has slight variations. In the present embodiment, the coefficient α is set to a median value (typical value) of the variations. In addition. Ta represents the ambient temperature of the MR sensor 63.

As described above, the amplitude A0 at normal temperature, the coefficient α, and the amplitude A in Expression (16) are known values. Therefore, the temperature Ta can be computed according to Expression (16). In the present embodiment, the peak-to-peak value App of the second and fourth electrical signals S2, S4 is used as the amplitude A in Expression (16) so as to ensure a dynamic range. Therefore, Expression (16) can be expressed by Expression (17).

$$2A = 2(A0 \pm \alpha \times Ta) \quad (17)$$

When Expression (17) is deformed with respect to the temperature Ta, Expression (17) can be expressed by Expression (18).

$$Ta = (A - A0) \pm \alpha \quad (18)$$

The microcomputer 42 can acquire the temperature Ta (estimated temperature) from the amplitude A according to Expression (18).

Because the median value of the variations is used as the coefficient α as described above, the temperature Ta computed according to Expression (18) has a slight variation corresponding to a difference between the median value and the upper limit or the lower limit of the variations.

The microcomputer 42 monitors whether an abnormality has occurred by comparing the temperature (the third temperature T3) detected by the temperature sensor 91 with the temperature Ta computed according to Expression (18). The microcomputer 42 determines that an abnormality has occurred in one of the second electrical signal S2 and the fourth electrical signal S4 that have been normal or in the temperature sensor 91 when a difference ΔT between the temperature Ta and the third temperature T3 exceeds a threshold temperature difference ΔTth. At this time, the microcomputer 42 stops the control of the motor 31. The threshold temperature difference ΔTth is stored in advance in the storage device 42a.

As described above, by comparing the first and second temperatures T1, T2 and the third temperature T3 acquired by the temperature sensor 91 with each other, it is possible to detect an abnormality of the MR sensor 63 and an abnormality of the temperature sensor 91 independently of each other. The microcomputer 42 stops the control of the motor 31 also when an abnormality of any one of the first and second temperatures T1, T2 is detected after an abnormality of the temperature sensor 91 is detected.

In the present embodiment, the detection of an abnormality during the backup control is executed by comparing the temperature Ta computed according to Expressions (12) to (18) on the basis of two normal electrical signals used in the backup control with the temperature (the third temperature T3) computed on the basis of the electrical signal Sth generated by the temperature sensor 91. The variations of the temperature Ta to be compared with the third temperature T3 is attributed only to the variations of the coefficient α (amplitude/temperature coefficient) that set to the median value of the variations. The degree of variations of the temperature Ta due to the variations of the coefficient α is lower than the degree of variations of the value of the sum of squares of the sine signal and the cosine signal that are influenced by the temperature. Therefore, unlike the case where an abnormality of the MR sensor 63 is detected on the basis of the value of the sum of squares, it is possible to appropriately set the allowable range (the upper limit and the lower limit of the threshold temperature difference ΔT) of values that should be recognized as being normal. That is, it is possible to prevent a temperature that should be recognized as being abnormal from falling within the allowable range.

The microcomputer 42 detects disconnection and short-circuit of the temperature sensor 91 on the basis of the value (voltage value) of the electrical signal Sth generated by the temperature sensor 91, as described above. In the present embodiment, it is possible to detect an intermediate failure (drift) of the temperature sensor 91. The intermediate failure means a failure that does not cause significant output variations unlike disconnection and short-circuit. The intermediate failure occurs due to gradual increases of detection errors, for example, because the sensor performance deteriorates with time.

The microcomputer 42 detects an intermediate failure of the temperature sensor 91 as follows. The microcomputer 42 detects an intermediate failure of the temperature sensor 91 by comparing the first to third temperatures T1 to T3 computed to detect the abnormality of the MR sensor 63 with each other. The microcomputer 42 detects the fact that an intermediate failure has occurred in the temperature sensor 91 when all of three conditions E, F, G are satisfied.

Condition E is a condition that the value of the electrical signal Sth is not equal to the voltage Vp (e.g. 5V) of the constant voltage source (Sth*Vp). Condition F is a condition that the value of the electrical signal Sth is not equal to the ground potential (e.g. 0V) (Sth≠the ground potential). Condition G is a condition that the first temperature T1 is equal to the second temperature T2 but not equal to the third temperature T3 (T1=T2≠T3). Usually, the microcomputer 42 executes temperature compensation control on the drive circuit 41 as follows. The microcomputer 42 estimates a temperature increase amount ΔTd, which is an amount of increase in the temperature of the drive circuit 41, on the basis of the above-described current command value. The microcomputer 42 operates the drive circuit 41 such that the temperature obtained by adding the estimated temperature increase amount ΔTd to the third temperature T3 acquired by the temperature sensor 91 does not exceed the rated temperature Tmax of the switching elements that constitute the drive circuit 41. The relationship among the third temperature T3, the temperature increase amount ΔTd, and the rated temperature Tmax is expressed by Expression (19).

$$T3+\Delta Td<T\max \quad (19)$$

The microcomputer 42 executes the temperature compensation control on the drive circuit 41, for example, using the first temperature T1 or the second temperature T2 when disconnection, short-circuit, or an intermediate failure of the temperature sensor 91 is detected. The first temperature T1 or the second temperature T2 is used instead of the third temperature T3 in Expression (19). In this way, it is possible to continue execution of the temperature compensation control on the drive circuit 41 even when an abnormality has occurred in the temperature sensor 91.

Whether to employ the method of detecting an abnormality of the MR sensor 63 on the basis of the value of the sum of squares as in the related art instead of the abnormality detection based on the comparison among the first to third temperatures T1 to T3 will be examined below.

It may be possible to detect an abnormality of the MR sensor 63 on the basis of the value of the sum of squares, by correcting the amplitude A of the first to fourth electrical signals S1 to S4 using the temperature sensor 91.

Figure 6:
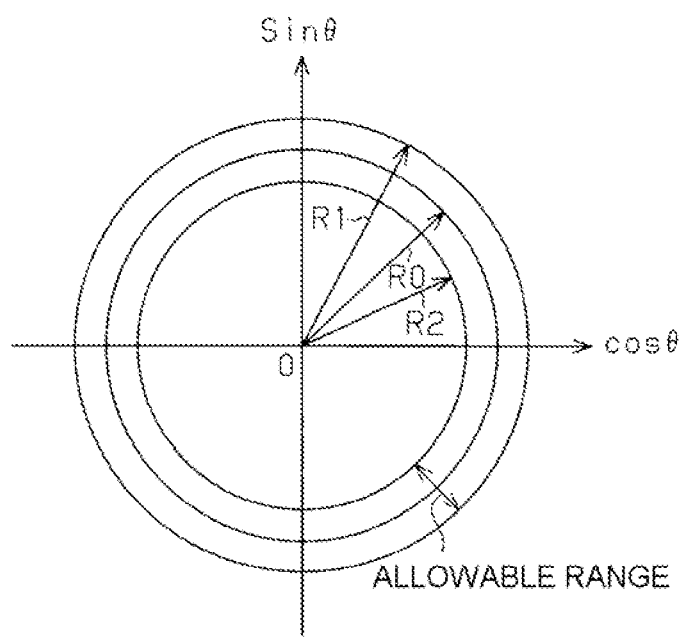
FIG. 6 is a Lissajous diagram illustrating an allowable range of values of the sum of squares of a cosine component (cos) and a sine component (sin) generated by the magnetic sensor.

By canceling the term (=±α·Ta) associated with the temperature Ta in Expression (16) on the basis of the temperature detected by the temperature sensor 91, the original amplitude A0 is obtained. Therefore, if the temperature detected by the temperature sensor 91 is accurate, it is possible to narrow the allowable range of values of the sum of squares, illustrated in FIG. 6, in the following manner. When the first and third electrical signals S1, S3 or the second and fourth electrical signals S2, S4 which are actually detected are plotted on the orthogonal coordinate system of cos θ and sin θ illustrated in FIG. 6, how much the plotted electrical signals deviate from the normal circle with a radius R0 is checked.

However, when the temperature detected by the temperature sensor 91 is not accurate, it is not possible to execute accurate correction. In the present embodiment, there is only one temperature sensor 91. However, when the MR sensor 63 is normally operating, it is possible to detect the presence or absence of an abnormality of the temperature sensor 91 through the comparison among the first to third temperatures T1 to T3. On the other hand, when the comparison among the first to third temperatures T1 to T3 is not executed, only the temperature sensor 91 is used to detect the temperature. The abnormalities of the temperature sensor 91 detected by the microcomputer 42 are only short-circuit and disconnection. Therefore, it is not clear whether the temperature acquired by the temperature sensor 91 is accurate.

Therefore, providing one more temperature sensor 91 may be considered. In this case, it is possible to monitor whether the two temperatures acquired by the two temperature sensors 91 are abnormal through comparison between the two temperatures. However, by providing one more temperature sensor 91, the failure rate is doubled. Accordingly, when any one of the two temperature sensors 91 fails, whether the acquired temperatures are accurate is not clear. As a result, the method of detecting an abnormality of the MR sensor 63 on the basis of only the value of the sum of squares is not employed.

According to the present embodiment, the following advantageous effects are obtained. The microcomputer 42 has a first abnormality detection function based on two Expressions (10), (11) and a second abnormality detection function based on comparison among the first to third temperatures T1 to T3. The microcomputer 42 is able to identify which of the first to fourth electrical signals S1 to S4 is abnormal, by comparing the results of detections based on the first and second abnormality detection functions.

Because the presence or absence of an abnormality of the MR sensor 63 of the rotation angle sensor 53 is detected based on the comparison among the temperatures correlated with the amplitude instead of the comparison based on the amplitude which is easily influenced by the temperature (comparison of the values of the sums of squares or the like), the result of detection of the presence or absence of an abnormality is not easily influenced by the temperature. Because the result of detection of the presence or absence of an abnormality is not easily influenced by the temperature, the capability of detecting an abnormality of the rotation angle sensor 53 is improved.

Because it is possible to identify which of the first to fourth electrical signals S1 to S4 is abnormal, the microcomputer 42 is able to switch the control of the motor 31 from the normal control to the backup control.

The presence or absence of an abnormality during the backup control is detected using the temperature sensor 91 for protecting the drive circuit 41 from overheating. Therefore, a temperature sensor for detecting an abnormality of the MR sensor 63 need not be provided. The failure rate or the like can be maintained at the same level as that in the related art.

Through the comparison among the first to third temperatures T1 to T3, it is possible to detect not only an abnormality of the MR sensor 63 but also an abnormality of the temperature sensor 91. Therefore, it is possible to prevent protection of the drive circuit 41 from overheating, from being erroneously executed.

When all of the first to fourth electrical signals S1 to S4 are normal and an abnormality has occurred in the temperature sensor 91, it is possible to back up the temperature sensor 91 with the use of at least one of the first and second temperatures T1, T2 computed on the basis of the first to fourth electrical signals S1 to S4. That is, even when an abnormality has occurred in the temperature sensor 91, it is possible to appropriately protect the drive circuit 41 from overheating.

The above-described embodiment may be modified as follows.

The MR sensor 63 may be a MR sensor in which a tunnel magnetoresistive element (TMR) is used or a MR sensor in which a giant magnetoresistive element (GMR) is used. Any magnetic sensor may be employed as the MR sensor 63 in the present embodiment, as long as the magnetic sensor generates four electrical signals S1 to S4 with variations of a bias magnetic field based on the rotation of the rotary shaft 31*a*.

The temperature sensor 91 in the present embodiment is a temperature sensor in which the thermistor 92 is used. Alternatively, a temperature sensor in which a thermocouple or the like is used may be employed as the temperature sensor 91.

In the present embodiment, the peak-to-peak value App of the electrical signal is computed as expressed by Expression (17). However, the peak-to-peak value App need not be computed. In this case, it is possible to compute the temperature Ta according to Expression (18) using the amplitude A computed according to Expression (16).

In the present embodiment, the rotation angle sensor 53 that detects the rotation angle θ of the rotary shaft 31*a* of the motor 31 is described. However, the present embodiment may be applied, for example, as an abnormality detection system for a rotation angle sensor that detects the rotation angle of the steering shaft 22. The target to be sensed by the rotation angle sensor is not limited to the rotary shaft disposed in a vehicle.

The configuration that can be understood from the above-described embodiment will be described below. In an abnormality detection system for a rotation angle sensor, including: a magnetic sensor that generates four electrical signals having different phases in accordance with rotation of a motor rotary shaft that is a sensing target; and a control circuit that computes a rotation angle of the rotary shaft on the basis of the four electrical signals generated by the magnetic sensor, the four electrical signals including positive and negative two sine signals having a phase difference of 180° and positive and negative two cosine signals having a phase difference of 180°, the system further includes a temperature sensor that detects an ambient temperature of the magnetic sensor, and the control circuit detects the presence or absence of an abnormality of the temperature sensor by comparing a first temperature computed on the basis of a correlation between a temperature and an amplitude acquired from a value of a sum of squares of the positive sine signal and the positive cosine signal, a second temperature computed on the basis of a correlation between a temperature and an amplitude acquired from a value of a sum of squares of the negative sine signal and the negative cosine signal, and a third temperature detected by the temperature sensor with each other.

According to this configuration, it is possible to detect the presence or absence of an abnormality of the temperature sensor by comparing the first to third temperatures with each other. The motor may serve as a drive source for an electric power steering system.

What is claimed is:

1. An abnormality detection system for a rotation angle sensor, comprising:
    a magnetic sensor that generates four electrical signals having different phases in accordance with rotation of a rotary shaft that is a sensing target;
    a temperature sensor that detects an ambient temperature of the magnetic sensor, and
    a control circuit that computes a rotation angle of the rotary shaft based on the four electrical signals generated by the magnetic sensor, wherein
    the four electrical signals include positive and negative two sine signals having a phase difference of 180° and positive and negative two cosine signals having a phase difference of 180°,
    the control circuit has
    a first detection function of detecting a fact that an abnormality has occurred in any one of the positive and negative two sine signals or in any one of the positive and negative two cosine signals based on a value of a sum of the positive and negative two sine signals and a value of a sum of the positive and negative two cosine signals, and
    a second detection function of detecting a fact that an abnormality has occurred in any one of the positive sine signal and the positive cosine signal or in any one of the negative sine signal and the negative cosine signal by comparing a first temperature computed based on a correlation between a temperature and an amplitude acquired from a value of a sum of squares of the positive sine signal and the positive cosine signal, a second temperature computed based on a correlation between a temperature and an amplitude acquired from a value of a sum of squares of the negative sine signal and the negative cosine signal, and a third temperature detected by the temperature sensor with each other, and
    the control circuit identifies which of the four electrical signals is abnormal by comparing results of detection obtained by the first detection function and the second detection function with each other.

2. The abnormality detection system for a rotation angle sensor according to claim 1, wherein:
    when a fact that an abnormality has occurred in any one of the four electrical signals is detected, the control circuit executes backup control in which the rotation angle is computed using the remaining normal positive sine and cosine signals or the remaining normal negative sine and cosine signals; and
    the control circuit detects a fact that an abnormality has occurred in any one of the remaining normal positive sine and cosine signals or the remaining normal negative sine and cosine signals, by comparing a temperature computed based on a correlation between a temperature and an amplitude acquired from a value of a sum of squares of the remaining normal positive sine and cosine signals or the remaining normal negative sine and cosine signals with the third temperature detected by the temperature sensor during execution of the backup control.

3. The abnormality detection system for a rotation angle sensor according to claim 1, wherein:
   the rotary shaft is a rotary shaft of a motor; and
   the temperature sensor is provided to protect a drive circuit of the motor from overheating.

4. The abnormality detection system for a rotation angle sensor according to claim 2, wherein:
   the rotary shaft is a rotary shaft of a motor; and
   the temperature sensor is provided to protect a drive circuit of the motor from overheating.

* * * * *